(12) United States Patent
Chauhan et al.

(10) Patent No.: US 7,057,284 B2
(45) Date of Patent: Jun. 6, 2006

(54) FINE PITCH LOW-COST FLIP CHIP SUBSTRATE

(75) Inventors: Satyendra S. Chauhan, Sugarland, TX (US); Masood Murtuza, Sugarland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/916,743

(22) Filed: Aug. 12, 2004

(65) Prior Publication Data

US 2006/0033210 A1    Feb. 16, 2006

(51) Int. Cl.
*H01L 23/48* (2006.01)

(52) U.S. Cl. .................... 257/737; 257/779
(58) Field of Classification Search ............ 257/737, 257/779

See application file for complete search history.

(56) References Cited

U.S. PATENT DOCUMENTS

| | | | |
|---|---|---|---|
| 6,389,689 B1* | 5/2002 | Heo | 29/840 |
| 6,431,432 B1* | 8/2002 | McCormick et al. | 228/254 |
| 6,622,380 B1* | 9/2003 | Grigg | 29/840 |
| 2003/0209807 A1* | 11/2003 | Hosomi | 257/774 |

* cited by examiner

*Primary Examiner*—Matthew Smith
*Assistant Examiner*—Lex H. Malsawma
(74) *Attorney, Agent, or Firm*—Yingsheng Tung; Wade James Brady, III; Frederick J. Telecky, Jr.

(57) ABSTRACT

A package is disclosed, which includes a substrate, a solder masker, and a first aperture through the solder mask. The substrate has a surface on which metal traces are formed. The solder mask covers at least a portion of the surface of the substrate. And the first aperture through the solder mask exposes a plurality of the metal traces.

10 Claims, 3 Drawing Sheets

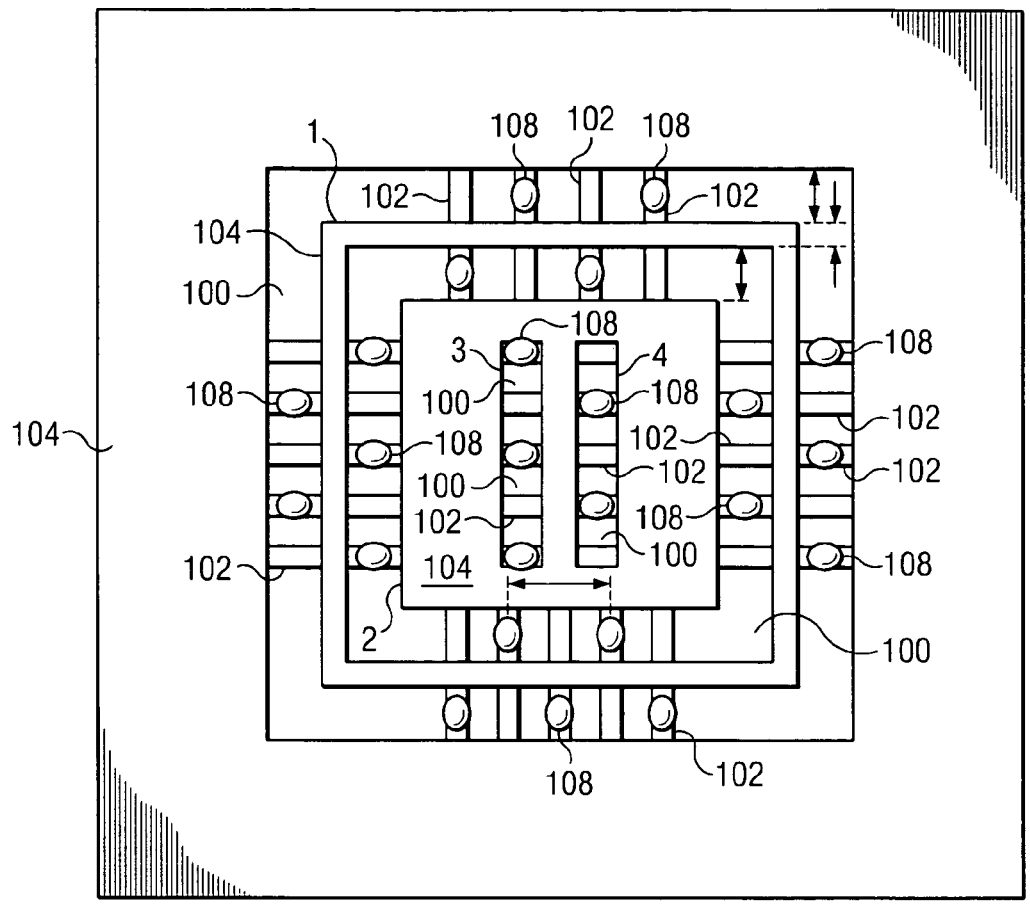
*FIG. 2b*
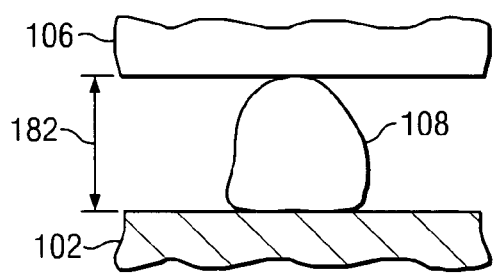
*FIG. 2c*
*FIG. 2d*
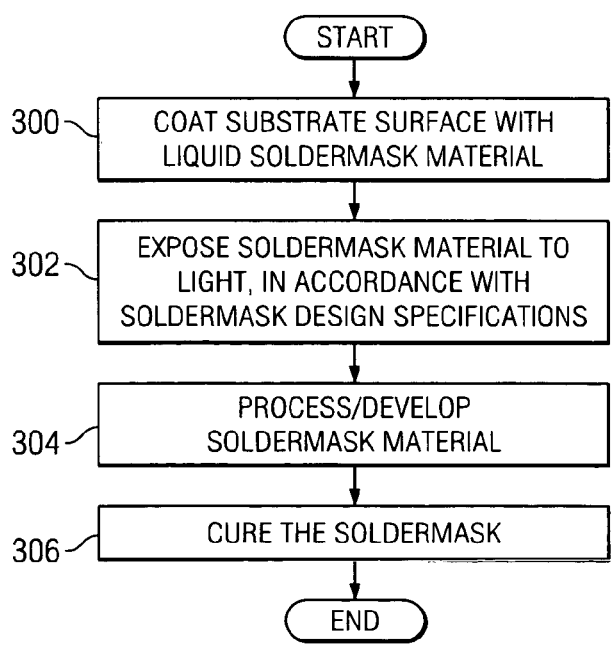
*FIG. 3*

FINE PITCH LOW-COST FLIP CHIP SUBSTRATE

BACKGROUND

Flip chip microelectronic assembly is the direct, face-to-face electrical connection of an integrated circuit ("IC") to a substrate or circuit board by means of conductive bumps (i.e., solder bumps) situated there between. More specifically, the IC is electrically connected to the substrate by way of the solder bumps during a solder reflow process, wherein the solder bumps are heated to cause the bumps to melt and establish an electrical connection between the IC and the substrate.

Substrates having solder bumps in relatively close proximity to each other are known as "fine pitch substrates." A concern with fine pitch substrates is the possibility of one or more short circuits on a substrate due to the excessive flow of solder during a solder reflow process. For example, during a reflow process on a fine pitch substrate, two closely-situated solder bumps may melt and come into contact with each other, thus causing a short circuit and possibly rendering the IC and/or the substrate useless. Solder also may flow into other areas of the substrate, causing short circuits in or otherwise damaging these areas. These short circuits also may render the IC and/or the substrate useless.

Thus, fine pitch substrates may use solder masks to prevent short-circuiting between two solder bumps. Soldermasks also may be used to prevent solder from flowing into other portions of the substrate, as mentioned above. Furthermore, solder masks also may be used to protect various portions of the substrate during various package assembly steps (e.g., wet processes that may damage portions of the substrate). As shown in FIG. 1, a soldermask 10 having precisely-defined openings 20 is placed over a substrate 30. The openings 20 then may be filled with solder bumps affixed to the metal traces 15. Because the openings 20 are precisely-defined, solder flow is contained within the boundaries of the openings 20. Portions of the solder mask 10 not exposing metal traces 15 protect the substrate 30 from solder reflow and from damage during other portions of the assembly process (e.g., wet processes). However, because the position and size of the openings 20 in a soldermask 10 designed for fine pitch substrates may need to be precisely controlled, soldermasks for fine pitch substrates are expensive to manufacture.

SUMMARY

The problems noted above are solved in large part by a fine pitch, low cost flip chip substrate. One exemplary embodiment may be a substrate having a surface comprising metal traces, a solder mask covering at least a portion of the surface of the substrate, and a first aperture through the solder mask exposing a plurality of metal traces.

Another embodiment may be a method comprising coating a substrate surface with soldermask material, forming a first aperture through the soldermask, wherein the first aperture exposes a plurality of metal traces of the substrate, and affixing a solder bump to at least one of the metal traces, wherein the solder bump is within the first aperture.

BRIEF DESCRIPTION OF THE DRAWINGS

For a detailed description of exemplary embodiments of the invention, reference will now be made to the accompanying drawings in which:

FIG. 2b shows a top view of the FCBGA package comprising a soldermask in accordance with various embodiments of the invention;

FIG. 2c shows a cross-sectional side view of a solder bump between a die and a substrate, wherein the clearance height between the die and substrate has been increased over a previous clearance height;

FIG. 2d shows the cross-sectional side view of the solder bump, die and substrate of FIG. 2c, wherein the clearance height between the die and substrate has been decreased over the previous clearance height; and FIG. 3 shows a process used to implement the soldermask of FIG. 2b, in accordance with embodiments of the invention.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Embodiments of the invention comprise a soldermask abutting a substrate (e.g., a FCBGA substrate) having multiple metal traces. Portions of some of the metal traces may be exposed from underneath the soldermask by way of one or more apertures in the solder mask. The apertures may be substantially rectangular in shape and may expose a plurality of metal traces, although other shapes also may be used. Each of the apertures may be separated from another aperture by a segment of the soldermask situated therebetween. Solder bumps may be formed abutting alternating metal traces in each aperture, although other solder bump arrangements also may be used. In alternate embodiments, sections of metal traces not having solder bumps may be covered with the soldermask.

The various embodiments are, at least to some extent, made possible by the realization that surface tension causes a melted solder bump on a substrate to cease flowing once the solder reaches an equilibrium point. For this reason, soldermasks with precisely-defined openings are unnecessary for fine pitch substrates and present higher production costs. Thus, a soldermask having less-precisely-defined openings than those described in the Background may be used to prevent short circuits caused by solder reflow. Presented herein is such a soldermask design that reduces cost, prevents short-circuits on fine pitch substrates during solder reflow processes, and protects the substrates from damage during various portions of the package assembly process.

Figure 2A:
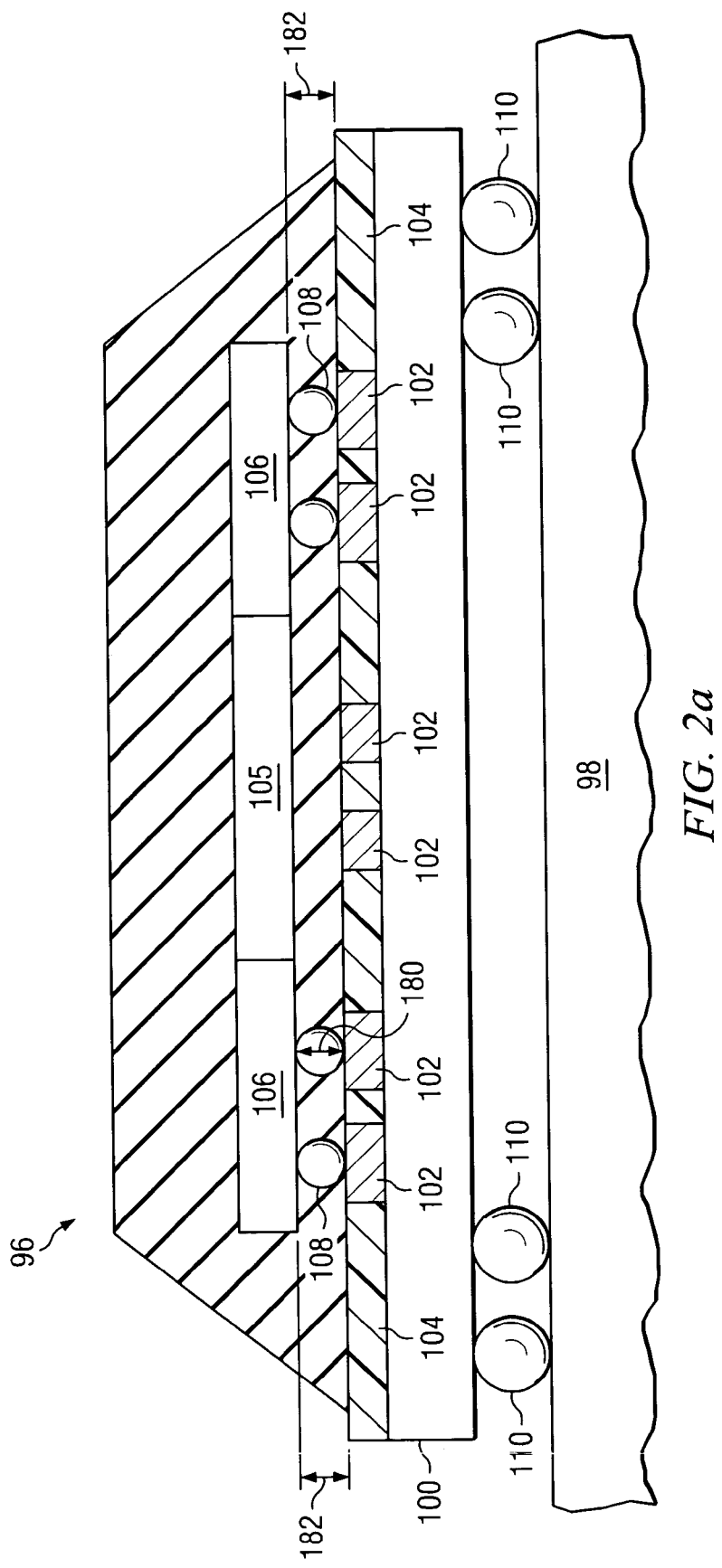
FIG. 2a shows a cross-sectional side view of a flip chip ball grid array ("FCBGA") package comprising a soldermask in accordance with embodiments of the invention.

FIG. 2a shows a cross-sectional side view of a flip-chip ball grid array ("FCBGA") package 96 comprising a substrate 100 partially covered by a solder mask 104 abutting the substrate 100. The substrate 100 comprises a plurality of metal traces 102. The metal traces 102 are electrically coupled to an IC 106 by way of solder bumps 108. The substrate 100 is electrically coupled to a printed circuit board ("PCB") 98 by way of solder bumps 110 situated therebetween. The metal traces 102 are used to receive electrical signals from the IC 106. In turn, the metal traces 102 carry the electrical signals through the substrate 100 to the PCB 98.

Figure 1:
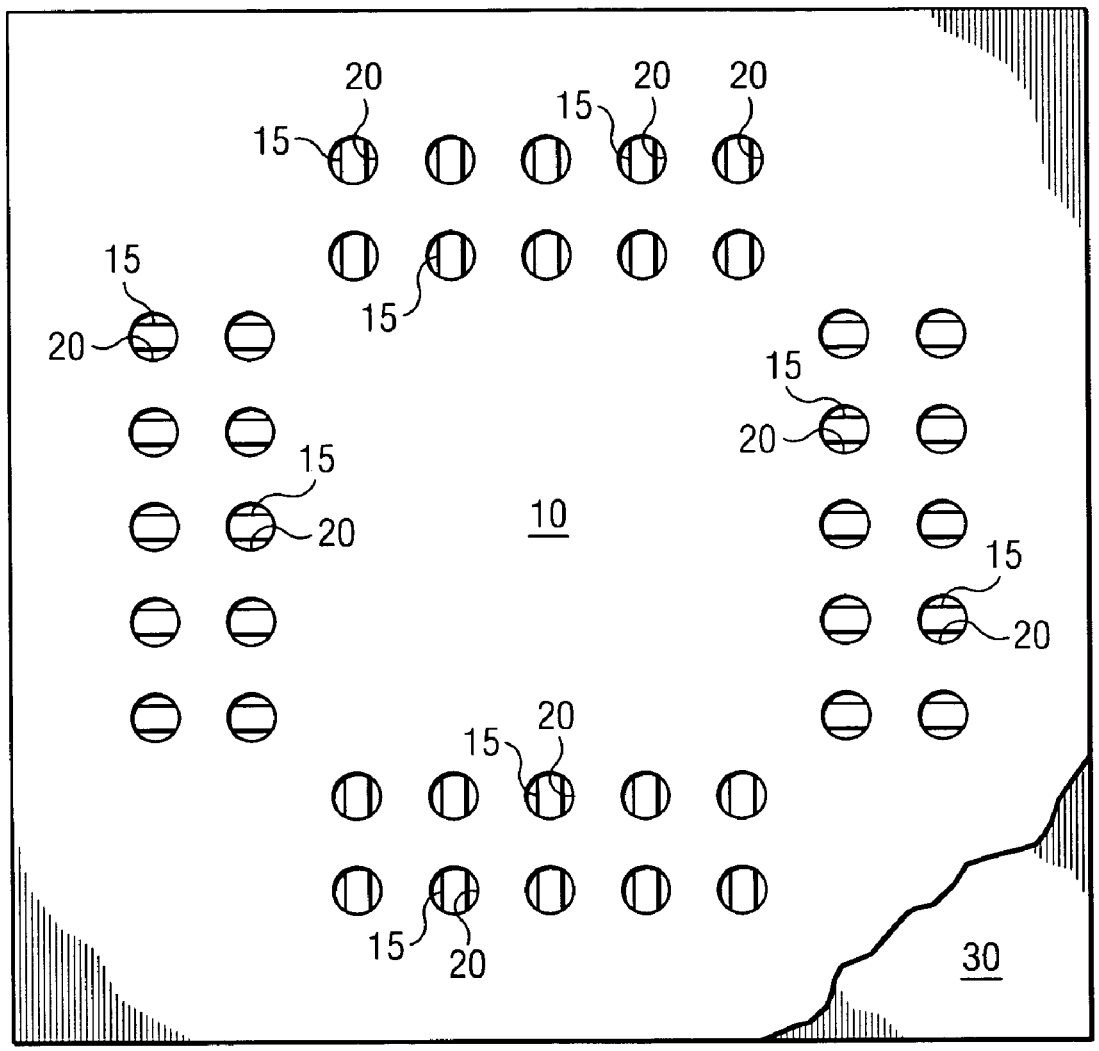
FIG. 1 shows a top view of a solder mask abutting a fine pitch substrate.

FIG. 2b shows a top view of the package 96 of FIG. 1 during electrical connection of the IC 106 (not shown) to the metal traces 102. Specifically, FIG. 2b illustrates the substrate 100 partially covered by the solder mask 104 abutting the substrate 100. The solder mask 104 comprises apertures 1–4 that expose the substrate 100. Each of the apertures 1–4 also exposes multiple metal traces 102, wherein at least some of the metal traces 102 are electrically coupled to solder bumps 108. More particularly, the apertures 3 and 4 are situated beneath a core 105 of the die 106 and expose multiple metal traces 102 on the substrate 100. The apertures 1 and 2 preferably are substantially continuous, concentric rectangles. Each of the apertures 3 and 4 preferably are continuous, substantially linear apertures, although the apertures 3 and 4 also may be arrange in a concentric rectangular configuration or any other suitable configuration. Any shape that enables the apertures 1–4 to be substantially continuous channels may be used.

The IC 106 (not shown) couples to the metal traces 102 preferably, but not necessarily, at the solder bumps 108. Whereas currently used soldermasks have precisely-defined solder bump openings for the solder bumps 108, the soldermask 104 permits the solder bumps 108 to be deposited on the metal traces 102 and flow until the solder reaches a state of equilibrium and ceases to flow. The solder of the solder bumps 108 ceases to flow before establishing contact (i.e., an electrical connection) with an adjacent metal trace 102 and/or an adjacent solder bump 108, thus reducing or eliminating the possibility of a short-circuit on the substrate 100.

In at least some embodiments, the solder bumps 108 are staggered such that the possibility of a short circuit caused by excessive solder flow is further reduced. More specifically, and referring to aperture 1, in accordance with at least some embodiments, no two adjacent metal traces 102 have a solder bump 108. Likewise, no two adjacent metal traces 102 in aperture 2 of the substrate 100 have a solder bump 108. Although not required, staggering the solder bumps 108 in this way further decreases the chances that solder may flow to electrically connect with an adjacent metal trace 102 and/or an adjacent solder bump 108 and cause a short circuit. As previously mentioned, the solder bumps 108 represent preferred solder bump locations. The scope of disclosure is not limited to these sites; a solder bump may be coupled to any suitable location on the metal traces 102.

In the various embodiments mentioned above, and as indicated by the arrows shown in FIG. 2b, the spacing between adjacent solder bumps 108 may be approximately 120 micrometers, the width of the soldermask 104 situated between apertures 1 and 2 may be approximately 105 micrometers, and the width of the apertures 1–4 may be approximately 105 micrometers each. Furthermore, the width of the metal traces 102 may be between approximately 30 and 45 micrometers, and the spacing between adjacent metal traces 102 (i.e., metal traces in the same unmasked portion of the substrate 100) may be between approximately 15 and 30 micrometers. The scope of disclosure is not limited to these parameters.

The risk of a short-circuit caused by electrical contact between a solder bump 108 and an adjacent solder bump 108 and/or an adjacent metal trace 102 may be mitigated further by adjusting the width of one or more of the apertures 3 and 4. Specifically, the flow of the solder bumps 108 may be controlled by adjusting the width of the apertures 3 and/or 4. Referring to FIGS. 2a and 2b, for example, reducing the width of the aperture 3 may cause the solder bumps 108 in the aperture 3 to flow less than if the aperture 3 was widened. Because the solder bumps 108 flow less, the heights 180 of the solder bumps 108 may increase. Conversely, increasing the width of the aperture 3 may cause the solder bumps 108 in the aperture 3 to flow more than if the width of the aperture 3 was decreased. Because the solder bumps 108 flow more, the heights 180 of the solder bumps 108 may decrease.

When the heights 180 of the solder bumps 108 in the aperture 3 are increased, the clearance height 182 between the die 106 and the metal traces 102 also increases. Conversely, when the heights 180 of the solder bumps 108 in the aperture 3 are decreased, the clearance height 182 is decreased. An increase in the clearance height 182, as illustrated in FIG. 2c, alleviates the pressure of the die 106 on the solder bumps 108 in the apertures 1,2 and 4. This decrease in pressure keeps each solder bump 108 from flowing a substantial distance away from the corresponding metal trace 102, thus further reducing the likelihood of a short circuit. A decrease in clearance height 182, as illustrated in FIG. 2d, increases the pressure of the die 106 on the solder bumps 108 in the apertures 1, 2 and 4. This increase in pressure forces each solder bump 108 to flow a greater distance from the corresponding metal trace 102 than that shown in FIG. 2c. Although the risk of a short circuit is somewhat increased, the die 106 is closer to the substrate 100, thus reducing overall size of the package 96. Because the risk of short circuits and the importance of the size of a package is largely application-specific, the width of the aperture 3 (and/or the apertures 1,2 and 4) may be adjusted accordingly. Although the widths of some or all of the apertures 1–4 may be adjusted, adjusting the apertures 3 and 4 generally is preferred, since in some embodiments, circuit design rules may be more lenient in the core 105 than in other portions of the die 106.

The soldermask 104 may be fabricated using a process shown in FIG. 3. The process may begin with the coating of the substrate surface with liquid soldermask material (block 300). Any suitable material may be used. The process may be continued by exposing the soldermask material to light in accordance with the design of the soldermask 104 (block 302). In this way, portions of the soldermask are chemically altered. The process may be further continued by processing or developing the soldermask using etchants, such that at least some of the portions of the soldermask are etched away, leaving a soldermask having a pattern substantially similar to the pattern of the soldermask 104 or some other desired soldermask pattern (block 304). Finally, the soldermask is cured, such as by heating the soldermask in an oven until the soldermask is dry and adhering to the substrate surface (block 306). Once solder bumps are affixed to the metal traces on the substrate, an integrated circuit or any such suitable device may be electrically coupled to the solder bumps.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A package, comprising:
   a substrate having a surface comprising metal traces;
   a solder mask covering a portion of the surface of the substrate; a first and a second substantially rectangular apertures through the solder mask, each aperture having a width, uncovering a plurality of metal traces; and
   a first solder bump on a first metal trace in the first aperture but not on a adjacent metal trace and a second solder bump on the adjacent metal trace in the second aperture but not on the first metal trace.

2. The package of claim 1, wherein the first aperture and the second aperture are approximately 105 micrometers apart.

3. The package of claim 1, wherein the substrate is a flip chip ball grid array package substrate.

4. The package of claim 1, wherein the first aperture has a maximum width of approximately 105 micrometers.

5. The package of claim 1, wherein two metal traces are spaced less than approximately 30 micrometers apart.

6. The package of claim 1, wherein at least a portion of the plurality of metal traces are less than approximately 45 micrometers in width.

7. The package of claim 1 in which an aperture in the soldermask is near a center of the substrate and exposing a plurality of metal traces.

8. The package of claim 1 further comprising solder bumps within the first and second apertures and on at least some of the metal traces, wherein a width of the second aperture is adjusted to control solder bump flow.

9. A package, comprising:
   a substrate having a surface comprising metal traces;
   a solder mask covering a portion of the surface of the substrate; a first and a second apertures through the solder mask, each aperture having a width, uncovering a plurality of metal traces;
   a first solder bump on a first metal trace in the first aperture;
   a second solder bump on a second metal trace in the first aperture; and
   a single metal trace between the first and second metal traces, said single metal trace not having a solder bump in the first aperture.

10. The package of claim 9, wherein the solder bumps are spaced at a maximum of approximately 120 micrometers apart.

* * * * *